United States Patent
Takahashi

Patent Number: 6,040,894
Date of Patent: *Mar. 21, 2000

[54] PROJECTION EXPOSURE APPARATUS AND DEVICE MANUFACTURING METHOD

[75] Inventor: Kazuhiro Takahashi, Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/959,301
[22] Filed: Oct. 28, 1997

[30] Foreign Application Priority Data

Oct. 29, 1996 [JP] Japan .................. 8-303902

[51] Int. Cl.⁷ ............... G03B 27/42; G03B 27/54
[52] U.S. Cl. ............................. 355/53; 355/67
[58] Field of Search .................. 355/53, 67, 77; 356/400–401, 399; 250/201.1, 205, 548

[56] References Cited

U.S. PATENT DOCUMENTS

| | | | |
|---|---|---|---|
| 4,874,954 | 10/1989 | Takahashi et al. | 250/548 |
| 5,153,419 | 10/1992 | Takahashi | 250/201.1 |
| 5,305,054 | 4/1994 | Suzuki et al. | 355/53 |
| 5,424,803 | 6/1995 | Noguchi | 355/53 |
| 5,436,692 | 7/1995 | Noguchi | 355/53 |
| 5,526,093 | 6/1996 | Takahashi | 355/53 |
| 5,574,537 | 11/1996 | Ozawa | 355/71 |
| 5,661,546 | 8/1997 | Taniguchi | 355/53 |
| 5,684,567 | 11/1997 | Shiozawa | 355/67 |
| 5,719,617 | 2/1998 | Takahashi | 347/241 |
| 5,726,739 | 3/1998 | Hayata | 355/67 |

FOREIGN PATENT DOCUMENTS

| | | |
|---|---|---|
| 5-47627 | 2/1993 | Japan . |
| 5-48933 | 7/1993 | Japan . |
| 6-22193 | 3/1994 | Japan . |
| 6-204123 | 7/1994 | Japan . |
| 7-130610 | 5/1995 | Japan . |

Primary Examiner—Alan A. Mathews
Assistant Examiner—Hung Henry Nguyen
Attorney, Agent, or Firm—Fitzpatrick, Cella, Harper & Scinto

[57] ABSTRACT

A projection exposure apparatus includes an illumination optical system for illuminating a mask with light from a light source, a projection optical system for projecting an image of a pattern of the mask being illuminated, the projection optical system having a pupil plane, a holding member for holding a substrate for receiving the image of the pattern, and a light detector for receiving light from the light source, passed through the projection optical system, wherein a light intensity distribution on the pupil plane is detectable on the basis of an output of the light detector, and wherein the light intensity distribution on the pupil plane can be adjusted as desired by adjusting the position of the light source on the basis of the detected light intensity distribution.

4 Claims, 13 Drawing Sheets

DIAMETER
OF IRIS
DIAPHRAGM 7a

EFFECTIVE LIGHT SOURCE DISTRIBUTION
AT DETECTOR 103 POSITION
FIG. 11A
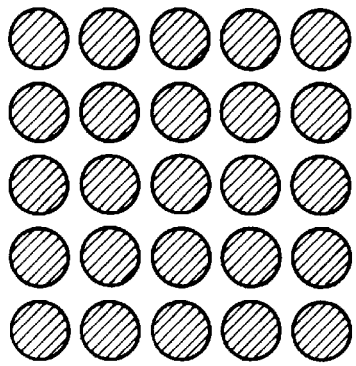
ILLUMINANCE DISTRIBUTION ONLY AT CIRCLES
DETECTOR GROUP FOR MEASURING
EFFECTIVE LIGHT SOURCE
FIG. 11B
| 1  | 2  | 3  | 4  | 5  |
|----|----|----|----|----|
| 6  | 7  | 8  | 9  | 10 |
| 11 | 12 | 13 | 14 | 15 |
| 16 | 17 | 18 | 19 | 20 |
| 21 | 22 | 23 | 24 | 25 |
DETECTOR GROUP OF 25 DETECTORS OF #1 – #25
25 DETECTORS CORRESPONDING TO NUMBER OF FLY'S EYE LENS ELEMENTS (CIRCLES IN FIG. 11A)
EXAMPLE OF MEASURED
EFFECTIVE LIGHT SOURCE
FIG. 12
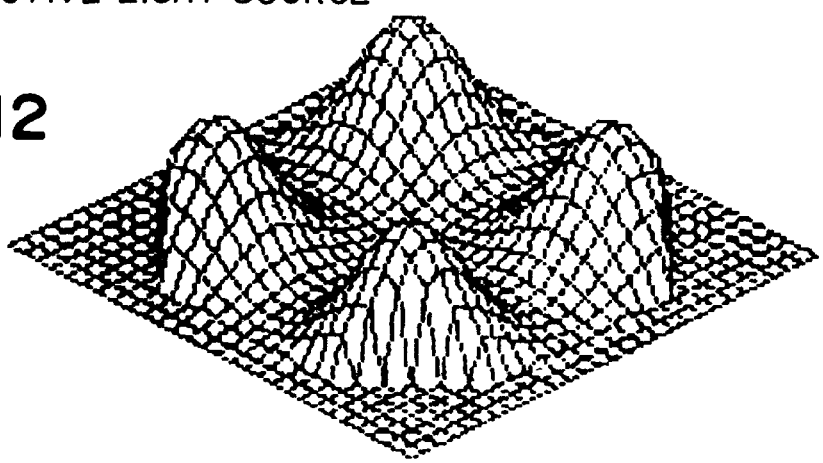

PROJECTION EXPOSURE APPARATUS AND DEVICE MANUFACTURING METHOD

FIELD OF THE INVENTION AND RELATED ART

This invention relates to a projection exposure apparatus and a device manufacturing method. More particularly, the invention is concerned with a step-and-repeat type or step-and-scan type projection exposure apparatus, as a device manufacturing apparatus, wherein a pattern formed on the surface of a reticle can be illuminated appropriately to assure high resolving power.

In projection exposure apparatuses for manufacture of semiconductor devices, in order to meet further increases of density of an integrated circuit, it has been required that a circuit pattern on the surface of a reticle can be projected and printed with a high resolving power. In many cases, enhancement of projection resolving power for a circuit pattern has been attained by using a larger numerical aperture (NA) of an optical system while fixing the exposure wavelength.

Recently, however, attempts have been made to change the exposure wavelength from g-line to i-line, or to use shorter wavelength of light such as KrF or ArF excimer laser light, to increase the resolving power. With the reduction of wavelength, the depth of focus reduces correspondingly.

Japanese Laid-Open Patent Application, Laid-Open No. 47627/1993 or No. 204123/1994, for example, shows an exposure method or a projection exposure apparatus using the same, wherein the method of illuminating the surface of a reticle is changed, that is, the light intensity distribution (effective light source distribution) to be defined on a pupil plane of a projection optical system is changed in various ways to thereby improve the resolving power.

Practical semiconductor device manufacturing procedure includes various processes, and there are a process wherein a high pattern resolving performance is required and a process wherein so high pattern resolving performance is not required. Further, regarding the shape of a pattern formed on the surface of a reticle, there are many pattern shapes such as a horizontal, vertical and inclined.

On the other hand, the effective light source distribution (light intensity distribution) on the pupil plane of a projection optical system (projection lens) greatly influences to the image performance (resolving power) of a projected pattern image. Thus, a semiconductor device manufacturing exposure apparatus should desirably include an illumination system that can perform optimum illumination of a reticle, best suited to the respective processes. Then, it is important that the components are set and maintained appropriately to ensure illumination of a reticle with a desired effective light source distribution. When the position of a light source, constituting the illumination system, shifts from its design position, then it becomes difficult to obtain a desired effective light source distribution, for example, even if the other components of the illumination system are disposed correctly. Finally, a high resolving power could not be provided.

SUMMARY OF THE INVENTION

It is an object of the present invention to provide a projection exposure apparatus and/or a device manufacturing method that enables a high resolving power.

In accordance with an aspect of the present invention, there is provided a projection exposure apparatus, comprising: an illumination optical system for illuminating a mask with light from a light source; a projection optical system for projecting an image of a pattern of the mask being illuminated, said projection optical system having a pupil plane; a holding member for holding a substrate for receiving the image of the pattern; and a light detector for receiving light from the light source, passed through said projection optical system; wherein a light intensity distribution on the pupil plane is detectable on the basis of an output of said light detector; and wherein the light intensity distribution on the pupil plane can be adjusted as desired by adjusting the position of the light source on the basis of the detected light intensity distribution.

The detected light intensity distribution may be displayed, and the adjustment of the position of the light source may be performed on the basis of the displayed light intensity distribution.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 11A and 11B are schematic views, respectively, for explaining the relation between a detector used in the present invention and the effective light source distribution.

FIG. 12 is a schematic view for explaining an example of effective light source distribution, to be measured in the present invention.

DESCRIPTION OF THE PREFERRED EMBODIMENTS

Figure 1:
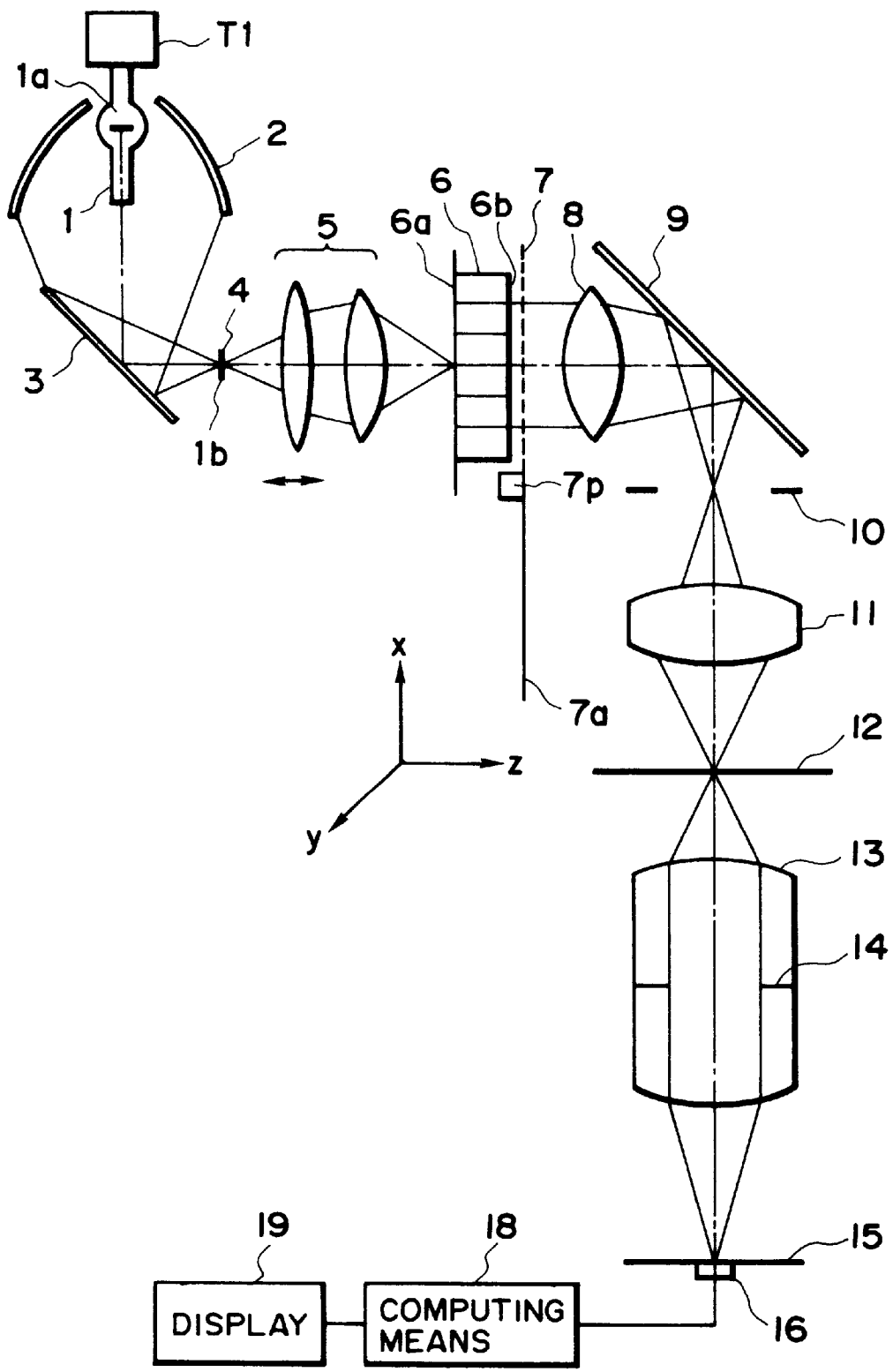
FIG. 1 is a schematic view of a main portion of a projection exposure apparatus according to a first embodiment of the present invention.

FIG. 1 shows a projection exposure apparatus according to a first embodiment of the present invention. Denoted in the drawing at 2 is an elliptical mirror. Denoted at 1 is a light emitting tube as a light source, which has a high luminance light emitting portion 1a for providing ultraviolet rays and deep ultraviolet rays. Denoted at T1 is a light source position adjusting mechanism (hereinafter "adjusting mechanism") which serves to move the light source 1 three-dimensionally on the basis of an effective light source distribution as formed on a pupil plane 14 in the manner to be described, to thereby adjust the position of the light emitting portion 1a. By the adjusting mechanism T1, the light emitting portion 1a can be positioned at its initial position which is at a predetermined position adjacent to the first focal point of the elliptical mirror 2. Denoted at 3 is a cold mirror which comprises a glass member having a multilayered film, for transmitting most of infrared light and for reflecting most of ultraviolet light. The elliptical mirror serves in association with the cold mirror 3 to form an image (light source image) 1b of the light emitting portion 1a, at a position adjacent to the second focal point 4 of the elliptical mirror 2.

Denoted at 5 is an optical system which may comprise a condenser lens or a zoom lens, for example, for imaging the light emitting portion image 1b formed adjacent to the second focal point 4, upon a light entrance surface 6a of an optical integrator 6. The optical integrator 6 comprises a plurality of small lenses $6_i$ (i=1 to N) which are arrayed two-dimensionally at a predetermined pitch to provide a fly's eye lens. Secondary light sources are defined in the vicinity of the light exit surface 6a of the integrator, with the light from the light source 1.

Figure 2A:
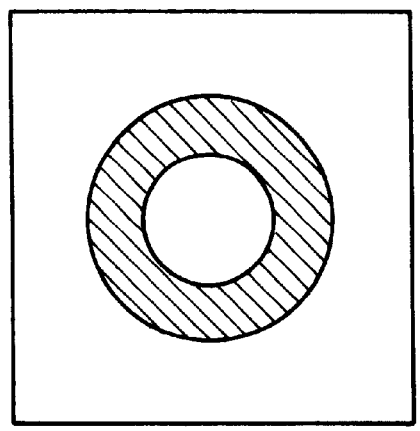
FIGS. 2A–2C are schematic views, respectively, for explaining a stop in the projection exposure apparatus of FIG. 1.
Figure 2B:
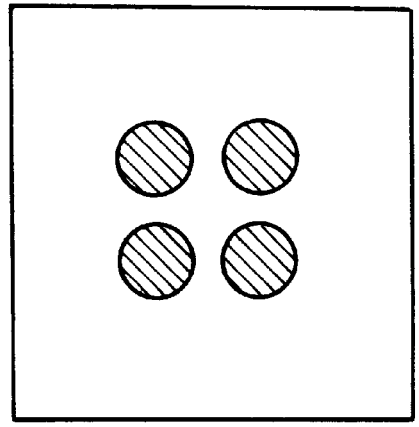
Figure 2C:
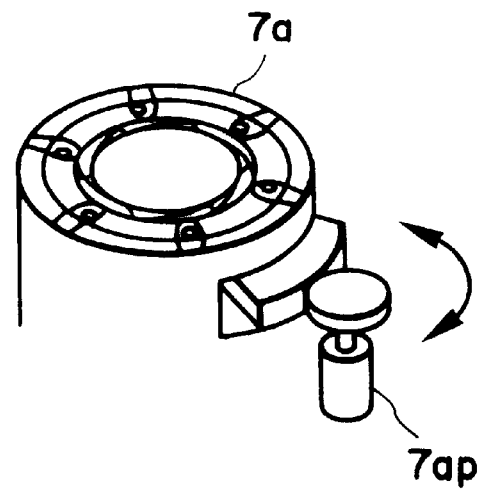

Denoted at 7 is a stop member which has an ordinary σ stop for producing a normal light intensity distribution on the pupil plane 14 of a projection lens 13, and a ring illumination stop or a quadruplicate-pole illumination stop, for changing the light intensity distribution on the pupil plane 14 from the normal light intensity distribution to one for grazing (oblique) illumination, for example, such as shown in FIG. 2A or 2B. In FIGS. 2A and 2B, the hatched portions correspond to apertures (light transmitting portions). Denoted at 7p is an actuator for interchanging the stop member 7. Denoted at 7a is an iris diaphragm which comprises plural stop plates such as shown in FIG. 2C. The stop 7a can be interchanged with the stop 7, by means of the actuator 7p. Denoted at 7ap is an actuator for changing the aperture diameter of the iris stop 7a.

In this embodiment, the light flux impinging on a condenser lens 8 can be changed in various ways, by use of the iris stop 7a. Each time the light flux is changed, the illuminance on the image plane of the projection optical system is measured to detect the light intensity distribution (i.e., the effective light source distribution) on the pupil plane 14 of the projection optical system 13. On the basis of the result of measurement, the position of the light source 1 is adjusted by using the adjusting mechanism T1, to thereby provide a desired effective light source.

The functions of the ordinary σ stop and the effective light source distribution measuring iris stop 7a may be provided in common member, and only the iris stop 7a may be provided without interchangeability. Further, when the effective light source distribution including the effect of a stop for grazing illumination (modified illumination) such as shown in FIG. 2A or 2B is to be measured, the iris stop may be disposed just after the stop for such modified illumination, and the effective light source distribution may be measured.

Denoted at 8 is a condenser lens. Light beams from the secondary light sources adjacent to the light exit surface 6b of the optical integrator 6 are collected by this condenser lens 8 and, after being reflected by a mirror 9, they are directed to a masking blade 10, such that the masking blade 10 is illuminated uniformly. The masking blade 10 comprises movable light blocking plates which can define a desired aperture shape.

Denoted at 11 is an imaging lens for transferring the aperture shape of the masking blade 10 on the surface of a reticle 12 (the surface to be illuminated), and thus for illuminating a required region of the reticle 12 surface uniformly.

Denoted at 13 is a projection optical system (projection lens) for projecting, in a reduced scale, a circuit pattern of the reticle 12 on to the surface of a wafer (substrate) 15 placed on a wafer chuck. Denoted at 14 is the pupil plane of the projection optical system 13. Denoted at 16 is a detector (detecting means) which may comprises a ultraviolet ray detector, for example. The detector 16 serves also as an illuminomitor for measuring the illuminance on the image plane, and it is so disposed that its light receiving surface is substantially coplanar with the surface of the wafer 15 to be exposed.

The detector 16 may be disposed so that its light receiving surface is coplanar with the surface of the circuit pattern of the reticle 12 which is optically conjugate with the surface of the wafer 15 to be exposed.

Denoted at 18 is a computing means for calculating and detecting the effective light source distribution on the pupil plane 14, on the basis of an output signal from the detector 16. Denoted at 19 is display means for displaying the effective light source distribution on the pupil plane 14 as calculated by the computing means 18.

In the optical arrangement of this embodiment, the light emitting portion 1a, the second focal point 4 and the light entrance surface 6a of the optical integrator 6 are in a substantially conjugate relation with each other. Also, the masking blade 10, the reticle 12 and the wafer 15 are in an optically conjugate relation. Further, the stop 7 and the pupil plane 14 of the projection optical system 13 are in a substantially conjugate relation.

With the structure of this embodiment, the pattern of the reticle 12 is projected in reduced scale on the wafer 15 surface. Then, through a predetermined development procedure, for example, semiconductor devices are produced.

Next, measurement of an effective light source distribution (illuminance distribution) on the exit pupil of the stop 7, that is, the pupil plane 14 of the projection optical system 13, will be explained.

For measurement of the effective light source distribution, the aperture of the iris stop 7a which is closed or restricted closest is gradually opened, while, on the other hand, the illuminance at the varying opening is measured by use of the ultraviolet ray detector 16.

Figure 3A:
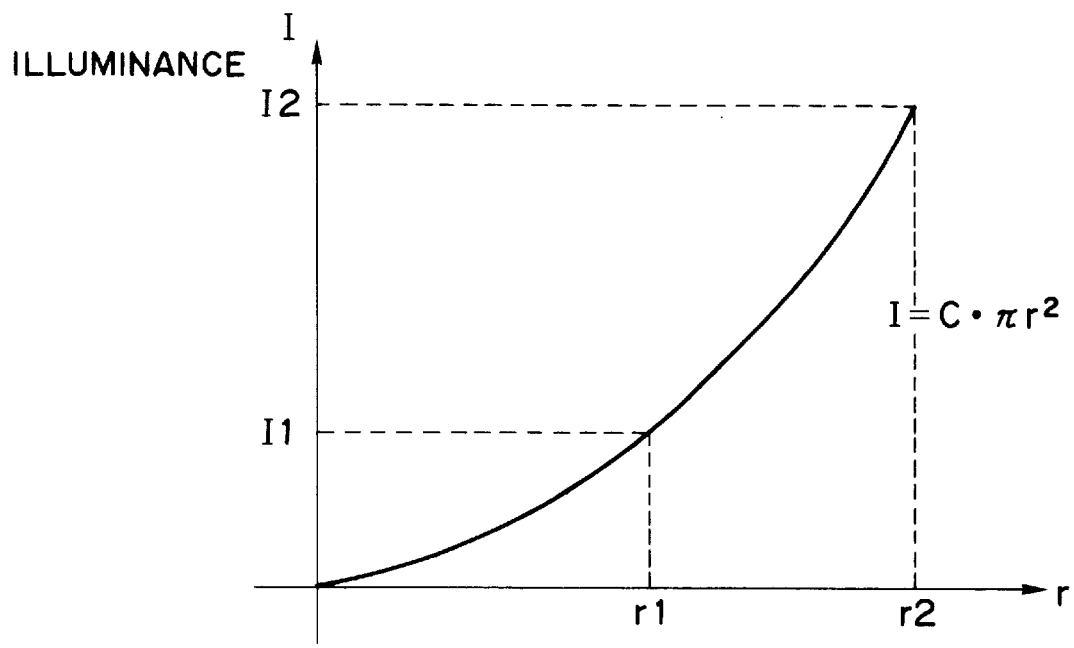
FIGS. 3A–3C are schematic views, respectively, for explaining the relation between the aperture stop diameter and the illuminance, in the projection exposure apparatus of FIG. 1.
Figure 3B:
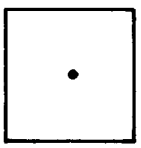
Figure 3B:
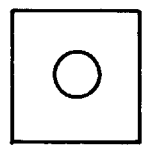
Figure 3B:
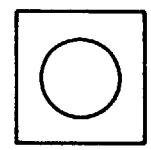

FIG. 3A is a graph for explaining the illuminance I on the wafer surface when the aperture of the iris stop 7a is gradually opened, the illuminance being illustrated as a function of the radius r of the aperture. In this example, the illuminance I is represented by a quadratic function of the radius r (I =C$\pi$r$^2$ where C is a constant). FIG. 3B schematically shows the diameter of the iris stop 7a, corresponding to the graph of FIG. 3A.

Assuming that the radius of the iris stop 7a is r and the value of illuminance as measured at that time by the ultraviolet ray detector 16 is I(r), and if the effective light source distribution is revolutionally symmetrical with respect to the optical axis of the projection optical system 13 (this applies in the case of normal illumination or ring illumination, for example), then the relative intensity of the effective light source distribution can be represented by a function f(r) of the radius r.

If the illuminance I is measured while changing the radius of aperture of the iris stop 7a incrementally by a unit of $\Delta$r, by using the illuminance I(r) the relative intensity of the effective light source can be expressed as follows:

$$f(r)=\{I(r+\Delta r)-I(r)\}/(2\pi r\Delta r) \qquad (1)$$

When the iris stop 7a is changed successively, $\Delta$r can be regarded as a small amount, and the relative intensity f(r) can be expressed by a differentiated value of the illuminance I:

$$f(r)=1/(2\pi r)dI/dr \qquad (2)$$

Figure 3C:
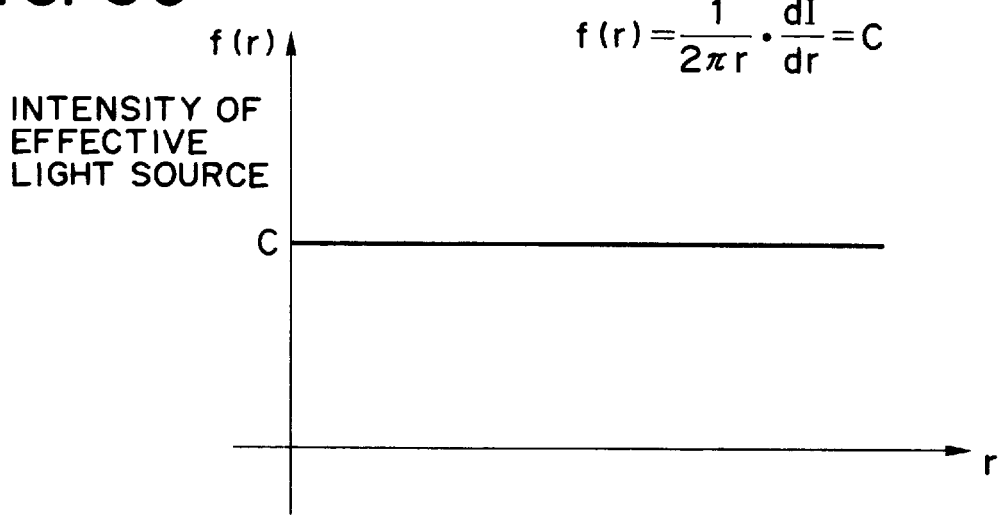

FIG. 3C illustrates the relative intensity f(r) of the effective light source as calculated by using equation (2). As illustrated, it is seen that when the illuminance I is a quadratic function the relative intensity f(r) is a constant, that is, a uniform effective light source distribution is provided. For practical determination of the effective light source distribution, by using the computing means 18 and on the basis of the result of measurement of the illuminance I(r), the relative intensity f(r) is calculated in accordance with equation (1) or (2).

In this embodiment, while monitoring the effective light source distribution as displayed by the displaying means 19, the position of the light source 1 may be moved in Z direction by means of the adjusting mechanism T1. This causes changes in relative intensity f(r). Here, f1(r) corresponding to a desired effective light source distribution which may be predetermined and f(r) as measured while moving the light source 1 may be compared with each other, and the position of the light source 1 may be adjusted by the adjusting mechanism T1 so as to assure the relation f(r)=f1(r). This is the position adjustment procedure.

For example, as shown in FIG. 3A, illuminances I1 and I2 at different radii r1 and r2 of the iris stop 7a may be measured, and the position of the light source 1 may be adjusted so that the ratio of illuminance I1/I2 becomes equal to a predetermined value. Also, such position adjustment procedure may be repeated as required.

Figure 14:
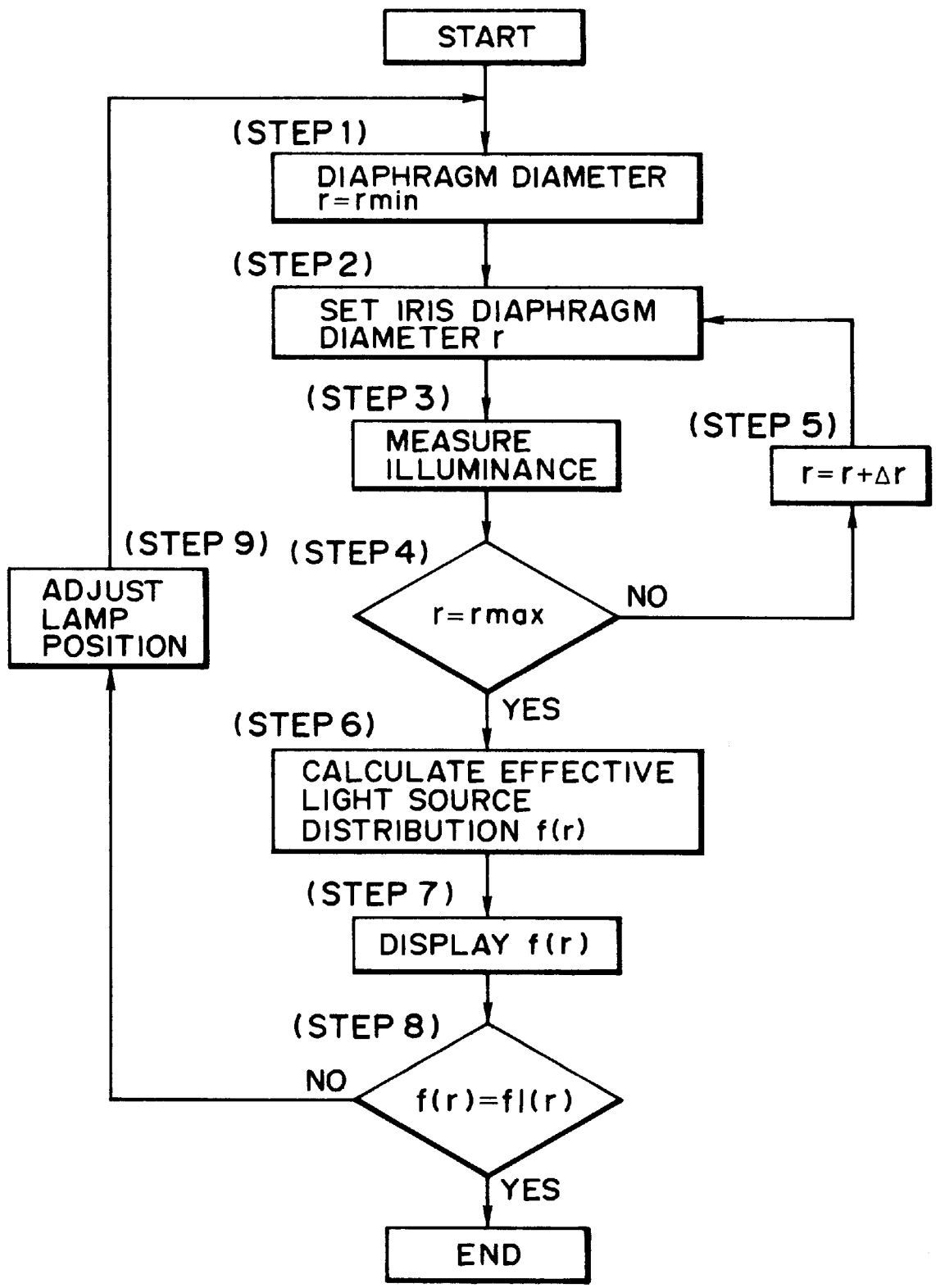
FIG. 14 is a flow chart for explaining the operation according to an embodiment of the present invention.

FIG. 14 is a flow chart of position adjustment procedure as described above. The flow chart of FIG. 14 relates to the light source position adjustment to be made in the embodiment of FIG. 1. At step 1, the iris stop diameter r=r$_{min}$, and at step 2 the iris stop diameter r is set at a certain value. At step 3, the illuminance I(r) is measured by the illuminometer. At step 4, the stop diameter r is discriminated and, if r$\neq$r$_{max}$ (r<r$_{max}$), the stop diameter r is changed at step 5. Then, steps 2 and 3 are repeated. If the stop diameter r is r=r$_{max}$, it means that all the measurements have been completed and, therefore, the effective light source distribution f(r) is calculated at step 6, on the basis of the results of measurements. The calculated effective light source distribution f(r) is displayed, at step 7. Then, at step 8, f(r) is compared with a desired effective light source distribution f1(r). If the former does not correspond to the latter, the lamp position is adjusted at step 9, and the procedure at steps 1–8 is repeated. If f(r) measured at step 8 corresponds to f1(r), the lamp position adjustment procedure is completed.

While this embodiment uses the ultraviolet ray detector 16, disposed adjacent to the wafer position, for measurement of the illuminance I(r), the detector 16 may be disposed in the vicinity of the reticle 12. Also, while in FIG. 1 the light source comprises a high pressure lamp such as Hg lamp, it may comprise a ultraviolet ray laser such as an excimer laser. In this embodiment, where the effective light source distribution is revolutionally symmetrical with respect to the optical axis, the effective light source distribution is averaged with the radius r of the aperture of the iris stop.

In this embodiment, as described, the effective light source distribution on the pupil plane 14 of the projection optical system 13 is detected and, on the basis of this, the position of the light source 1 with respect to the optical axis direction (Z direction) is adjusted so that the effective light source distribution (illumination mode) for projection exposure of the pattern of the reticle 12 on to the wafer 15 surface can be set appropriately. This effectively improves the resolving power of the projected pattern image.

Next, a second embodiment of the present invention will be described.

This embodiment specifically concerns a case where the effective light source distribution is revolutionally asymmetrical with respect to the optical axis. Since the structure of this embodiment is substantially the same as that of the first embodiment, description will be made with reference to FIG. 1.

Figure 4:
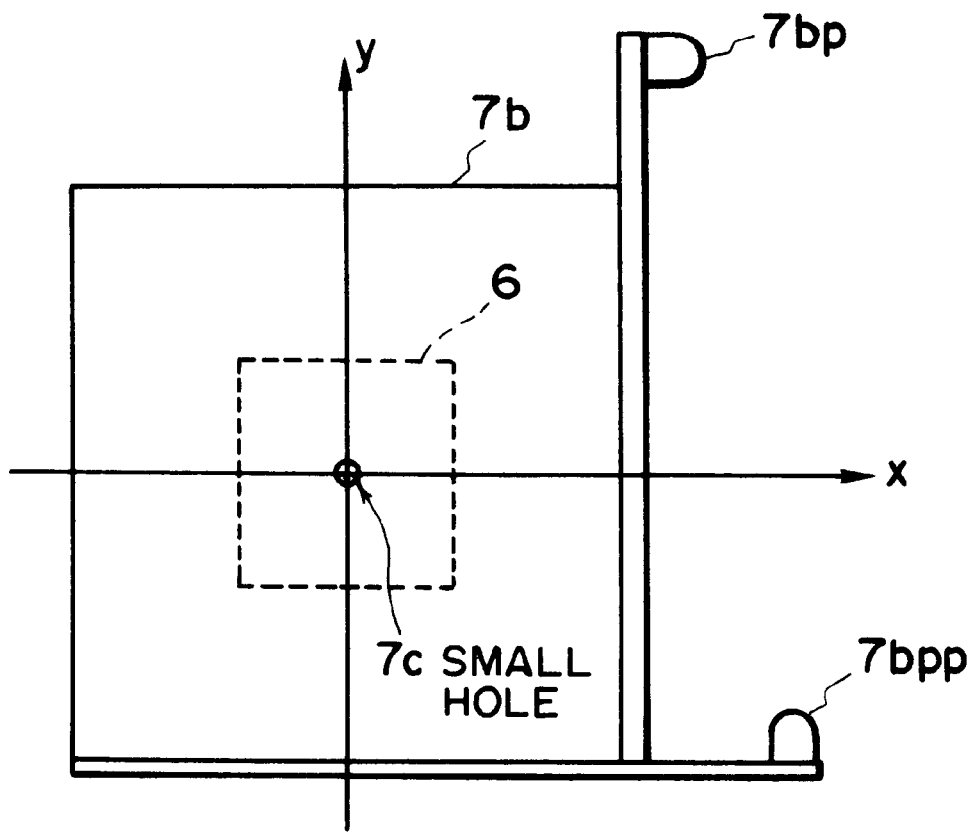
FIG. 4 is a schematic view for explaining a stop in a projection exposure apparatus according to a second embodiment of the present invention.

In this embodiment, in place of the iris stop 7a of FIG. 1, a small-hole stop 7b such as shown in FIG. 4 is used. The small-hole stop 7b comprises a stop member having a small hole (small aperture) 7c. Denoted at 7bp and 7bpp are actuators for displacing the small-hole stop 7b along X and Y axes, i.e., along the plane perpendicular to the optical axis.

By moving the small-hole stop 7b in this manner, all the lights coming from various portions of the optical integrator 6 are scanned, such that the light passing therethrough can be changed. Where the illuminance is measured by the ultraviolet ray detector 16 each time the small hole is shifted, the intensity of effective light source corresponding to the position of the small hole 7c can be measured, and thus, through the scan with the small hole 7c, the effective light source distribution (light intensity distribution) can be measured. Also, where the effective light source distribution including the effect of the stop for grazing illumination is to be measured, the small-hole stop 7b may be disposed just after the stop for grazing illumination, and the effective light source may be measured.

It is now assumed that the coordinate of the center of the small hole 7c is (x, y) and the value of illuminance as measured at that time by the detector 16 is I(x, y). Since the area of the stop is constant (the area of the small hole is constant), as compared with the first embodiment, the relative intensity f(x, y) of the effective light source is proportional to the illuminance I(x, y). Thus, the distribution of the illuminance I(x, y) corresponds to the effective light source distribution. By using the small hole 7c of smaller area and by scanning it with a smaller pitch, the effective light source distribution can be measured with higher precision.

In this embodiment, from the two-dimensional effective light source distribution as measured as described, the symmetry of the effective light source distribution is calculated by using the computing means 18. For example, if the sum of measured values of the effective light source distribution in a range x>0 is Ix+ and similarly the sum of measured values of the effective light source distribution in a range x>0 is Ix−, the position of the light source 1 with respect to X direction may be adjusted by the adjusting mechanism T1 so as to provide the relation Ix+=Ix−. Also, with regard to Y direction, the position of the light source 1 may be adjusted in a similar manner, whereby an effective light source which is symmetrical with respect to the optical axis can be provided.

While this embodiment uses a ultraviolet ray detector disposed adjacent to the wafer, for illuminance measurement, the detector may be disposed in the vicinity of the reticle 12.

Figure 5:
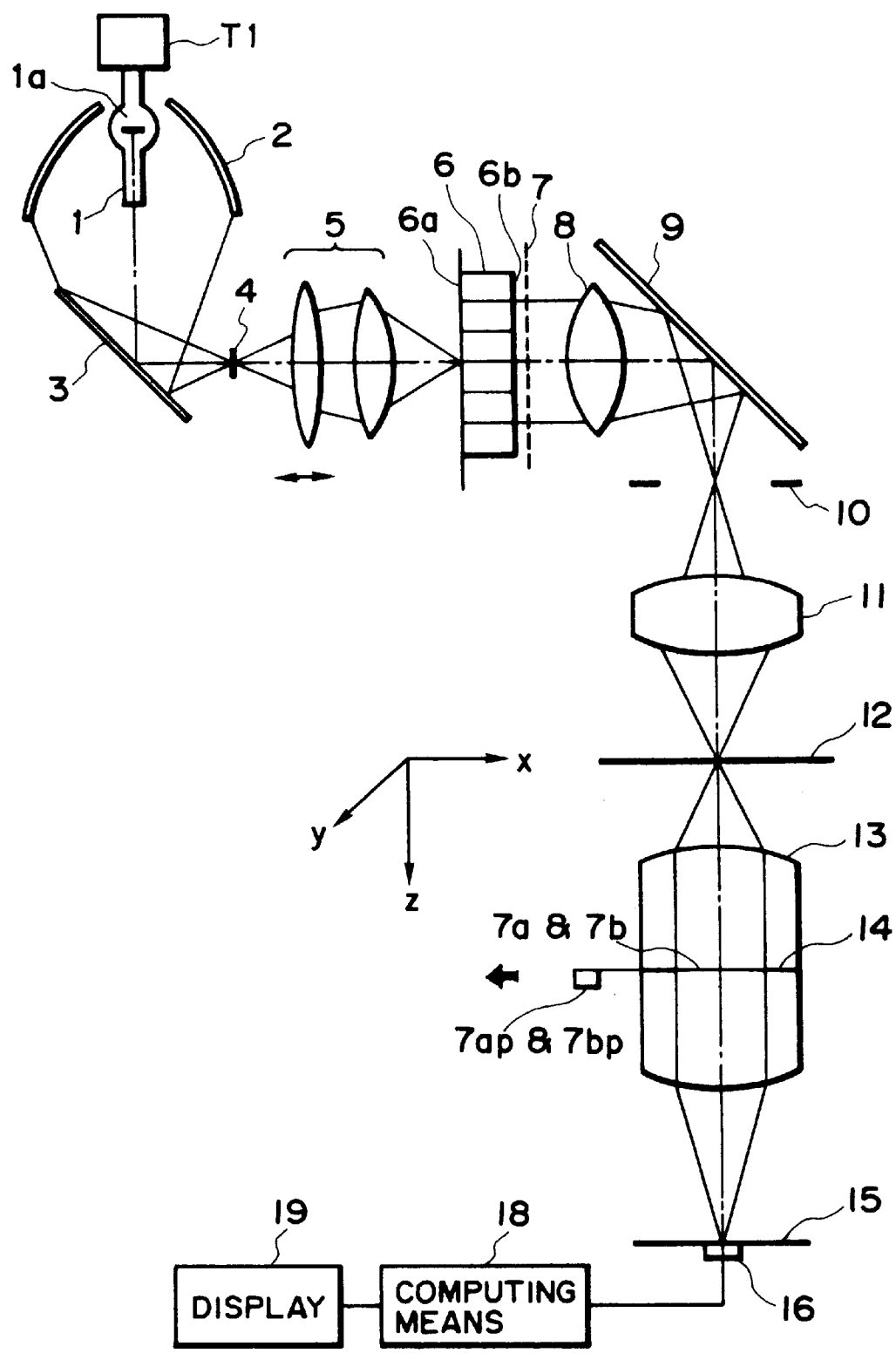
FIG. 5 is a schematic view of a main portion of a projection exposure apparatus according to a third embodiment of the present invention.

FIG. 5 is a schematic view of a main portion of a projection exposure apparatus according to a third embodiment of the present invention.

In the first and second embodiments of FIG. 1, the effective light source distribution measurement stop 7a or 7b is disposed at a position within the illumination system which is approximately conjugate with the pupil plane 14 of the projection optical system 13. In this embodiment, as compared therewith, the stop is provided adjacent to the pupil plane 14 of the projection optical system 13. The remaining portion of this embodiment has substantially the same structure as of the first and second embodiments. In FIG. 5, the elements corresponding to those of FIG. 1 are denoted by corresponding reference numerals.

In this embodiment, the iris stop 7a is provided in the vicinity of the pupil plane 14. As the first embodiment, each time the iris stop 7a is moved, the illuminance is measured by using the ultraviolet ray detector 16 disposed adjacent to the wafer 15. Then, by using the computing means 18, the effective light source distribution is calculated in accordance with equation (1) or (2), and the position of the light source 1 is adjusted by the adjusting mechanism T1 in accordance with the result of measurement.

Where a small-hole stop 7b is provided adjacent to the pupil plane 14, like the second embodiment, the illuminance may be measured by using the detector 16 disposed adjacent to the wafer each time the small-hole stop 7b is moved. By this, the effective light source distribution can be measured. Where the small-hole stop 7b is disposed adjacent to the pupil plane 14, before practical exposure operation the small-hole stop may be changed by a stop for exposure process, by using the actuator 17ap and 7bpr.

Figure 6:
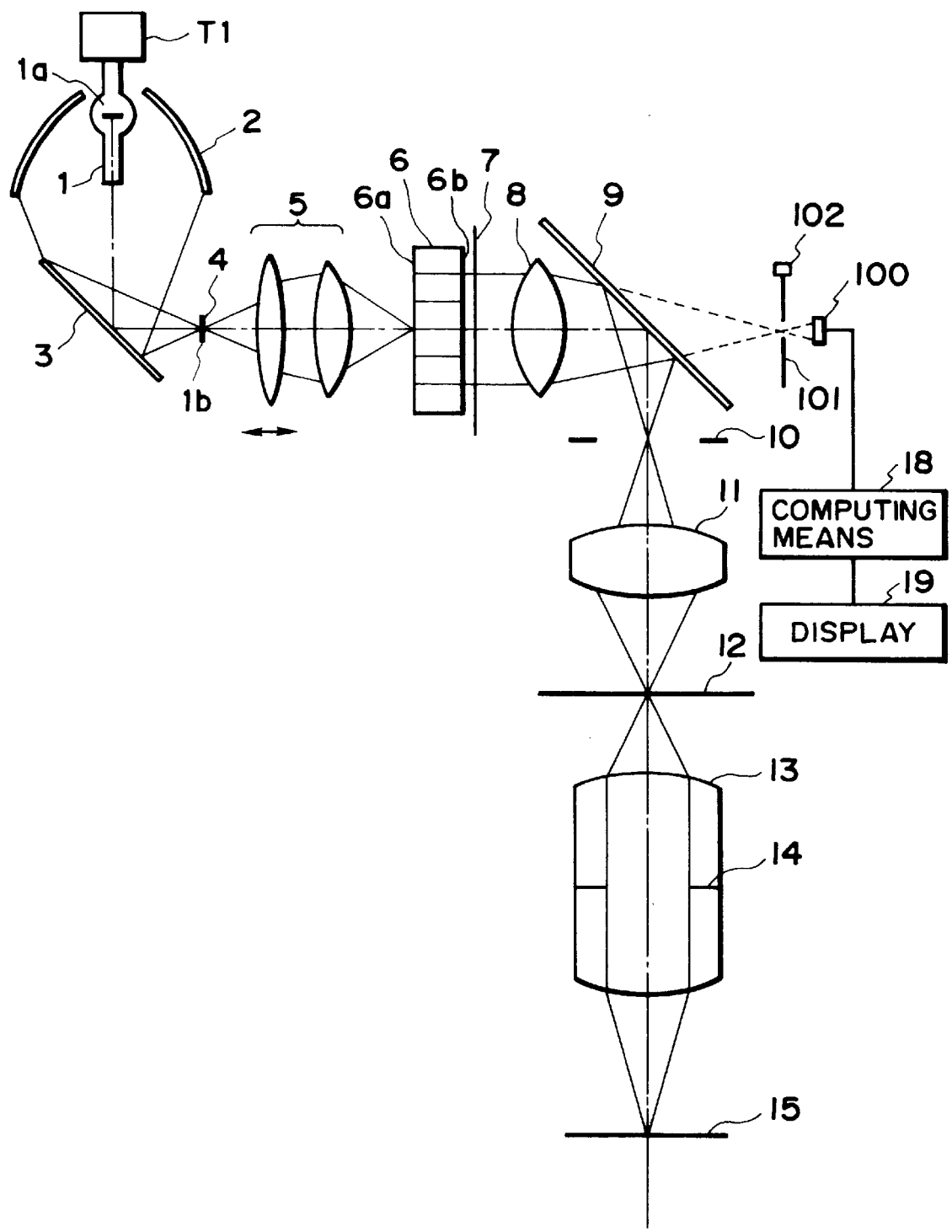
FIG. 6 is a schematic view of a main portion of a projection exposure apparatus according to a fourth embodiment of the present invention.

FIG. 6 is a schematic view of a main portion of a projection exposure apparatus according to a fourth embodiment of the present invention.

This embodiment differs from the first embodiment of FIG. 1 in that: a half mirror 9a having a high reflectivity and a low transmissivity is used in place of the total reflection mirror 9; a detector (detecting means) 100 such as a CCD, for example, is provided at a position optically conjugate through the half mirror 9a with the stop 7 (i.e., the pupil plane 14 of the projection optical system 13) to measure the effective light source distribution on the pupil plane 14; and a ultraviolet ray detector 16 is not used for the reticle or wafer surface. The remaining portion has substantially the same structure.

In FIG. 6, denoted at 101 is a pinhole member which can be moved by an actuator 102 along a plane perpendicular to the optical axis. In this embodiment, a light source image on the stop 7 is formed on the surface of the detector 100 in accordance with the principle of a pinhole camera, and the effective light source distribution on the pupil plane 14 is detected. Alternatively, the pinhole member 101 may be moved along plane perpendicular to the optical axis, and based on this, the effective light source distribution on the pupil plane of the projection optical system 13 may be detected by using the computing means 18. On the basis of the result of measurement, the distribution is displayed by the displaying means and, while monitoring the displayed distribution, the adjusting mechanism T1 is used to adjust the position of the light source 1. The detector 100 also may be moved similarly to the pinhole member 101, as required.

Figure 7:
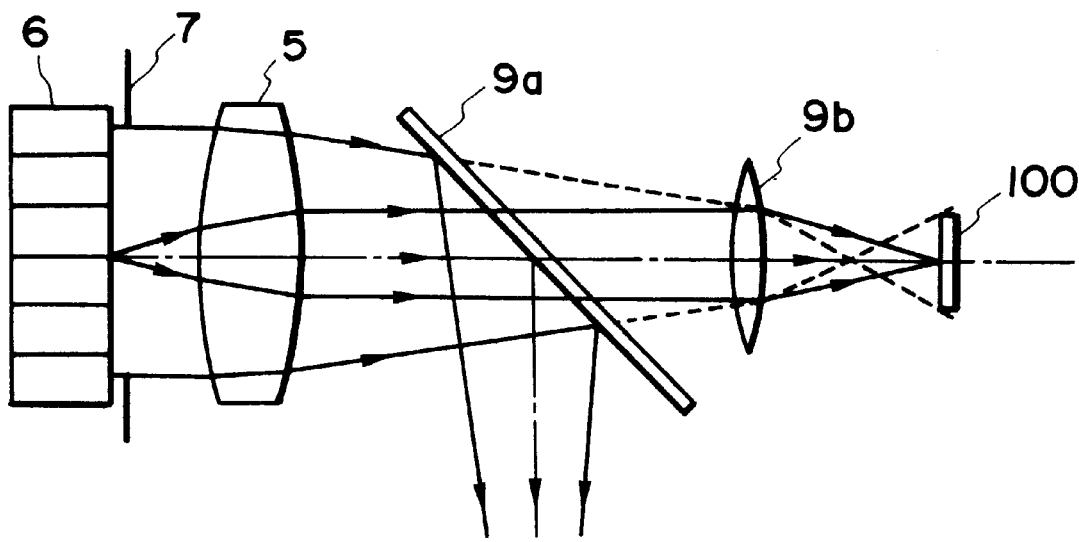
FIG. 7 is a schematic view of a portion of a projection exposure apparatus according to a fifth embodiment of the present invention.

FIG. 7 is a schematic view of a portion of a projection exposure apparatus according to a fifth embodiment of the present invention.

In this embodiment, as compared with the fourth embodiment of FIG. 6, a lens member 9b is disposed behind the half mirror 9a to direct the light passing through the half mirror 9a to the surface of the detector 100 such as a CCD, for example. The detector 100 and the stop 7 are disposed in a substantially conjugate relation. By using the detector 100, the illuminance distribution on the stop 7 surface is measured, by which the effective light source distribution can be detected. In this embodiment, the lens portion 9b is provided, which assures measurement of superposition of effective light sources at all the image heights.

Figure 8:
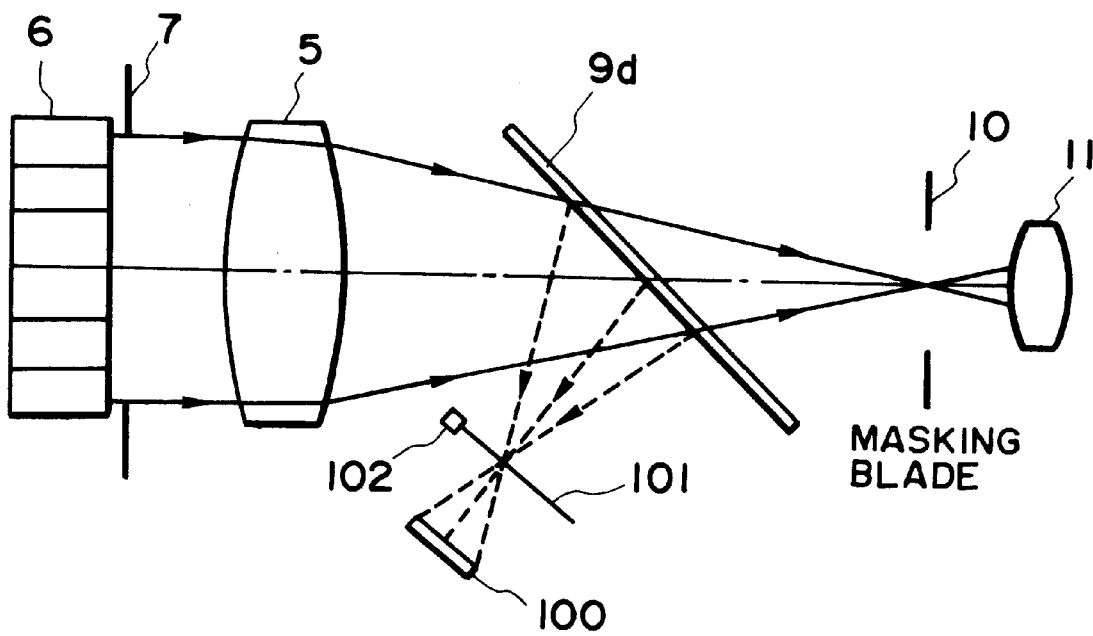
FIG. 8 is a schematic view of a portion of a projection exposure apparatus according to a sixth embodiment of the present invention.
Figure 9:
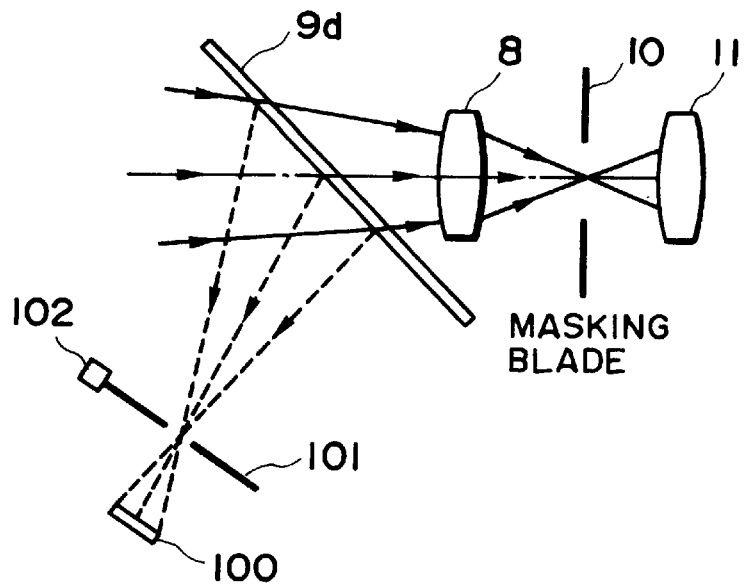
FIG. 9 is a schematic view of a portion of a projection exposure apparatus according to a seventh embodiment of the present invention.
Figure 10:
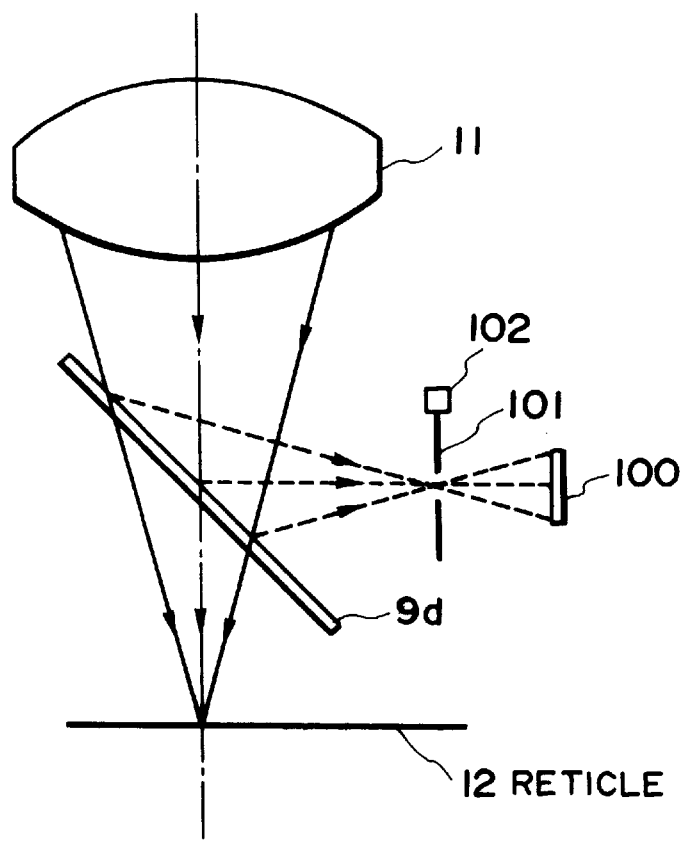
FIG. 10 is a schematic view of a portion of a projection exposure apparatus according to an eighth embodiment of the present invention.

FIGS. 8, 9 and 10 are schematic views, respectively, of portions of projection exposure apparatuses according to sixth, seventh and eights embodiments of the present invention, respectively.

In the sixth embodiment of FIG. 8, as compared with the fourth embodiment of FIG. 6, a half mirror 9d, having a property that the quantity of transmitted light is larger than the quantity of reflected light, is used, and the reflected light from the half mirror 9d is detected through the pinhole member 101 and by using the detector 100. The remaining portion has substantially the same structure.

In the seventh embodiment of FIG. 9, as compared with the fourth embodiment of FIG. 6, a half mirror 9d having a property that the quantity of transmitted light is larger than the quantity of reflected light, is disposed between the stop 7 (not shown) and the condenser lens 8, and reflected light from the half mirror 9d is detected through the pinhole member 101 and by using the detector 100. The remaining portion has substantially the same structure.

In the eighth embodiment of FIG. 10, as compared with the fourth embodiment of FIG. 6, a half mirror 9d having a property that the quantity of transmitted light is larger than the quantity of reflected light, is disposed between the imaging lens 11 and the reticle 12, and reflected light from the half mirror 9d is detected through the pinhole member 101 and by using the detector 100. The remaining portion has substantially the same structure.

In the fourth to eighth embodiments, as the detector 100, a two-dimensional detector such as a CCD or a sensor having divided light receiving surfaces may be used to execute measurement of two-dimensional distribution. This enables measurement of effective light source distribution at once. On that occasion, the pinhole member 101 may be disposed substantially at the same level as the wafer 15 surface, and measurement may be made by using it.

Practically, the effective light source distribution at the detector 100 comprises a combination of images of the lenses of the fly's eye lens, such as shown in FIG. 11A. FIG. 11A corresponds to a case where the fly's eye lens comprises small lenses of a number 5×5 (25 in total). It is seen that as illustrated there are illuminances only in those regions corresponding to 5×5 (25 in total).

Thus, it is seen that measurement of effective light source distribution may be made by using a detector group (FIG. 11B) having detectors of a number corresponding to that of the lenses of the fly's eye lens, being arrayed in matrix. Further, without using detectors of the number of that of the lenses of the fly's eye lens, only main portions may be measured. For example, in Figure 11B, there may be detectors 1, 5, 21, 25 and 13 (or 3, 11, 15, 23 and 13) at four corners and five detectors at the central portion, only.

Further, by operating the actuator, the pinhole member 101 may be moved to enable off-axis effective light source distribution measurement, in addition to measurement of the on-axis distribution. If in that occasion the image of the effective light source goes outside beyond the light receiving region of the detector as a result of movement of the pinhole member, the detector 100 may be moved in accordance with the pinhole movement.

FIG. 12 shows an example of effective light source distribution as measured in accordance with the method of this embodiment and as being displayed by the displaying means 19. In the case as illustrated, there is an effective light source distribution corresponding to the quadruplicate-pole illumination shown in FIG. 2B. The effective light source distribution is measured two-dimensionally as described and, while monitoring the effective light source distribution being displayed at the displaying means 19, the position of the light source 1 is adjusted by using the adjusting mechanism T1 so as to provide a desired effective light source distribution.

In the embodiments described above, the quantity of light impinging on the wafer (i.e., the exposure amount) may be monitored essentially in the same manner. Thus, the mechanism may be used as an exposure measuring system.

Figure 13:
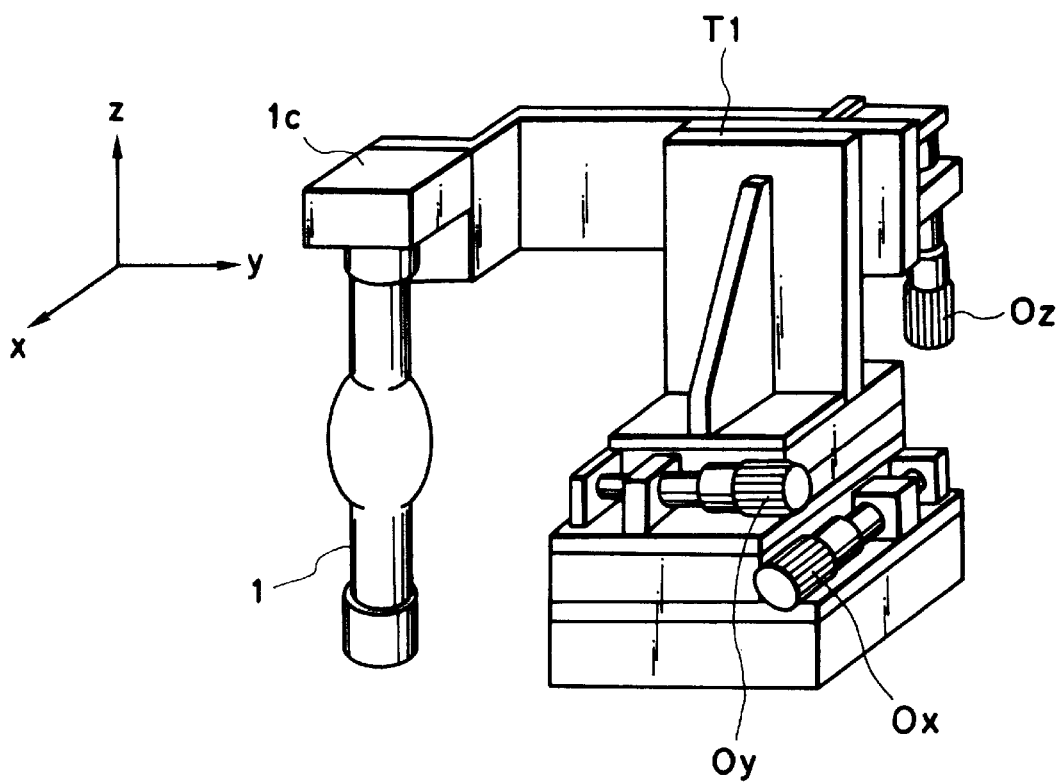
FIG. 13 is a schematic view of an adjustment mechanism which can be used in the present invention.

FIG. 13 shows an example of light source position adjusting mechanism T1 according to the present invention.

In FIG. 13, the light source 1 comprises a discharge lamp such as a Hg lamp. The electrode portion at one side is held by a holding member 1c. The position of the light source 1 in X, Y and Z directions can be adjusted in accordance with the result of measurement of the effective light source distribution, by rotating knobs Ox, Oy and Oz, connected to the holding member 1c, for moving the light source 1 in X, Y and Z directions. These knobs may be rotated by a motor, for example. For position adjustment of light source 1 when it comprises a laser light source such as an excimer laser, the relative position of the laser beam and a predetermined optical element inside the illumination optical system may be adjusted by moving the optical element.

Next, an embodiment of device manufacturing method that uses a projection exposure apparatus such as described above, will be explained.

Figure 15:
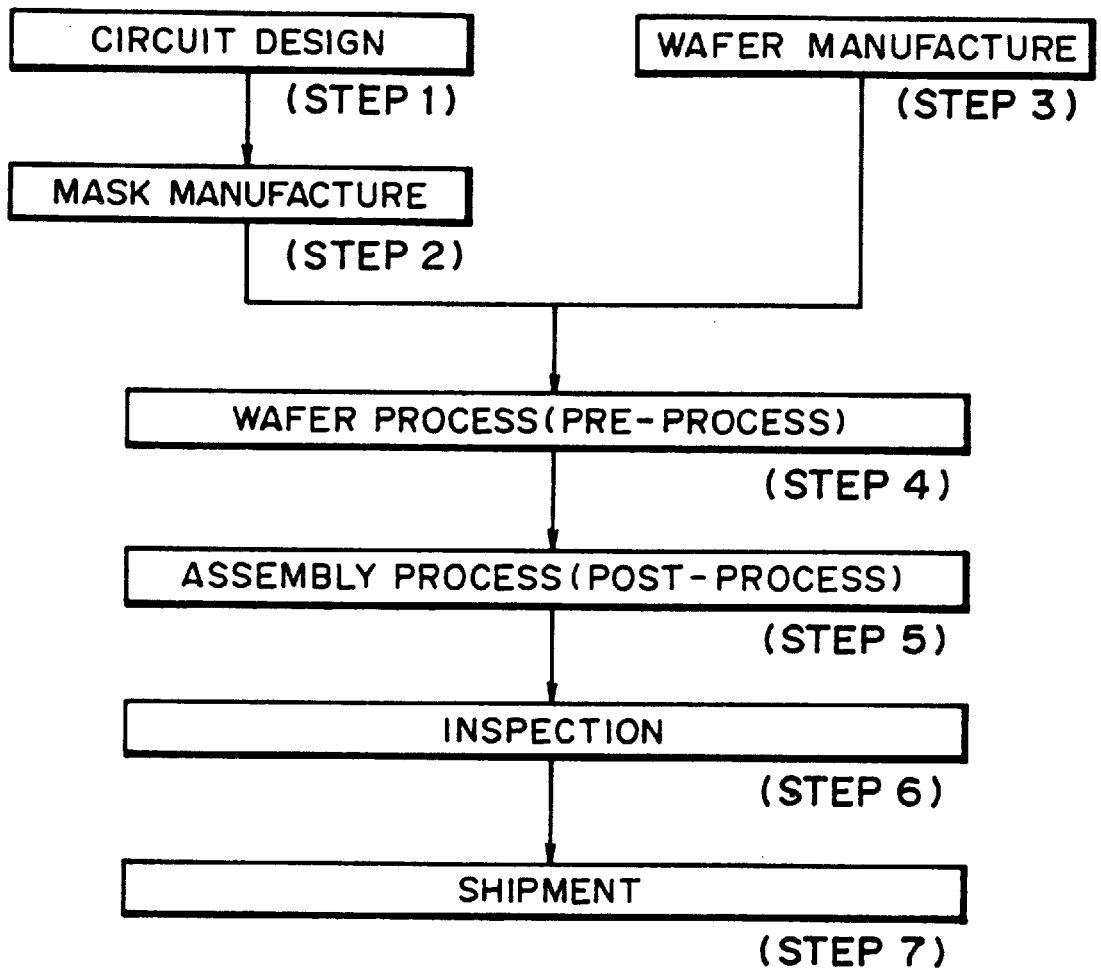
FIG. 15 is a flow chart of a semiconductor device manufacturing method, according to an embodiment of the present invention.

FIG. 15 is a flow chart of procedure for manufacture of microdevices such as semiconductor chips (e.g. ICs or LSIs), or liquid crystal panels, CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) process and packaging (chip sealing) process. Step 6 is an inspection step wherein operation check, durability check and so on for the semiconductor devices provided by step 5, are carried out. With these processes, semiconductor devices are completed and they are shipped (step 7).

Figure 16:
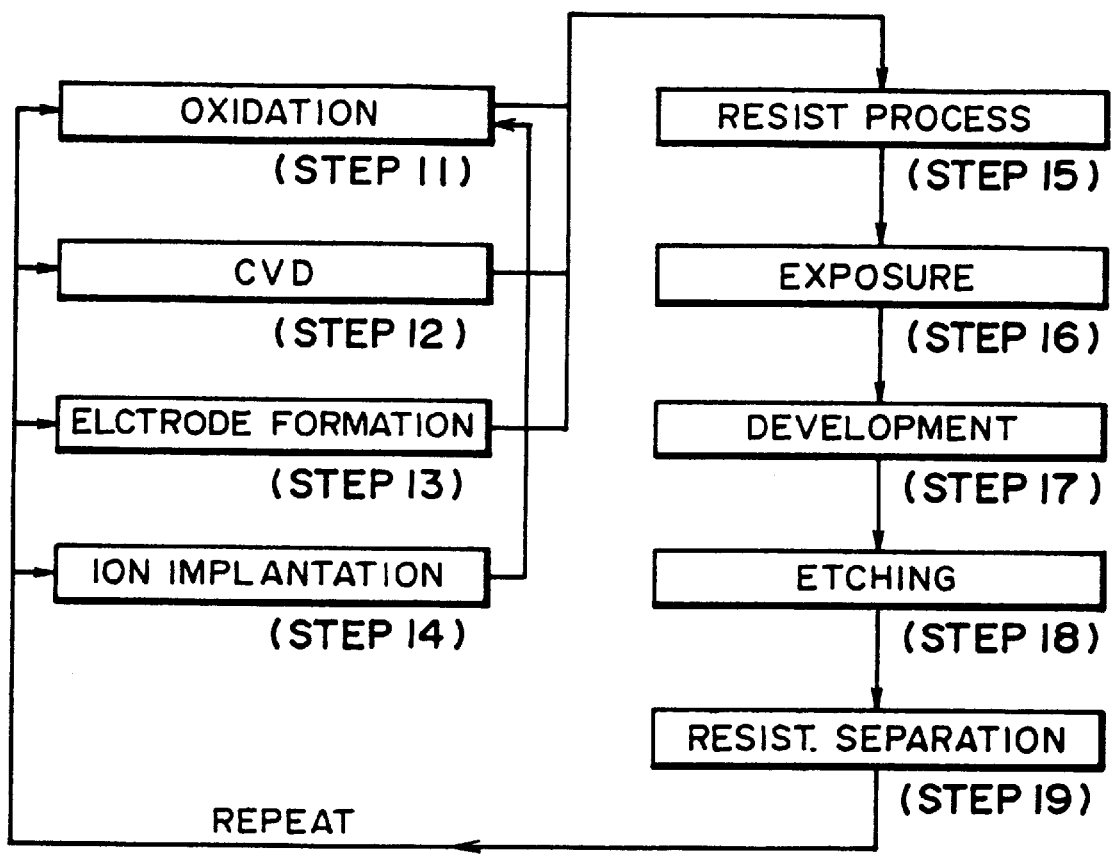
FIG. 16 is a flow chart of a semiconductor device manufacturing method, according to an embodiment of the present invention.

FIG. 16 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

I claim:

1. A projection exposure apparatus, comprising:

an illumination optical system for illuminating a mask with light from a light source;

a projection optical system for projecting an image of a pattern of the mask being illuminated, said projection optical system having a pupil plane;

a holding member for holding a substrate for receiving the image of the pattern;

a light detector for receiving light from the light source, passed through said projection optical system;

stop means, disposed adjacent to at least one of the pupil plane and a plane optically conjugate with the pupil plane, having a variable aperture for selectively passing light, wherein said light detector performs light detection a plurality of times while the aperture of said stop means is changed;

determining means for determining a light intensity distribution upon the pupil plane based on outputs of said light detector corresponding to the plural light detections; and adjusting means for adjusting the light intensity distribution on the pupil plane as desired by adjusting a position of the light source based on the determined light intensity distribution.

2. An apparatus according to claim 1, wherein the determined light intensity distribution is displayed, and said adjusting means adjusts the position of the light source based on the displayed light intensity.

3. In an arrangement having a projection exposure apparatus that includes an illumination optical system for illuminating a mask with light from a light source; a projection optical system for projecting an image of a pattern of the mask being illuminated, the projection optical system having a pupil plane; a holding member for holding a substrate for receiving the image of the pattern; a light detector for receiving light from the light source, passed through said projection optical system; stop means, disposed adjacent to at least one of the pupil plane and a plane optically conjugate with the pupil plane, having a variable aperture for selectively passing light, wherein the light detector performs light detection a plurality of times while the aperture of the stop means is changed; determining means for determining a light intensity distribution upon the pupil plane based on outputs of the light detector corresponding to the plural light detections; and adjusting means for adjusting the light intensity distribution on the pupil plane as desired by adjusting a position of the light source based on the determined light intensity distribution, a device manufacturing method comprising the step of:

transferring an image of a device pattern onto a substrate by use of the projection exposure apparatus.

4. In an arrangement having a projection exposure apparatus that includes an illumination optical system for illuminating a mask with light from a light source; a projection optical system for projecting an image of a pattern of the mask being illuminated, the projection optical system having a pupil plane; a holding member for holding a substrate for receiving the image of the pattern; a light detector for receiving light from the light source, passed through said projection optical system; stop means, disposed adjacent to at least one of the pupil plane and a plane optically conjugate with the pupil plane, having a variable aperture for selectively passing light, wherein the light detector performs light detection a plurality of times while the aperture of the stop means is changed; determining means for determining a light intensity distribution upon the pupil plane based on outputs of the light detector corresponding to the plural light detections; and adjusting means for adjusting the light intensity distribution on the pupil plane as desired by adjusting a position of the light source based on the determined light intensity distribution, a device manufacturing method comprising the step of:

transferring an image of a device pattern onto a substrate by use of the projection exposure apparatus including displaying the light intensity distribution upon the pupil plane and adjusting the position of the light source based on the displayed light intensity.

* * * * *

UNITED STATES PATENT AND TRADEMARK OFFICE
CERTIFICATE OF CORRECTION

PATENT NO.   :  6,040,894
DATED        :  March 21, 2000
INVENTOR(S)  :  KAZUHIRO TAKAHASHI It is certified that error appears in the above-identified patent and that said Letters Patent is hereby corrected as shown below:

COLUMN 1:
    Line 45, "to" should be deleted.

COLUMN 4:
    Line 27, "comprises" should read --comprise--.

COLUMN 7:
    Line 48, "17ap and 7bpr." should read --7ap and 7bp.--.

Signed and Sealed this

Third Day of April, 2001

Attest:

NICHOLAS P. GODICI

Attesting Officer     Acting Director of the United States Patent and Trademark Office